(12) United States Patent
Robinson et al.

(10) Patent No.: US 7,307,460 B2
(45) Date of Patent: Dec. 11, 2007

(54) METHOD AND APPARATUS FOR CAPACITANCE MULTIPLICATION WITHIN A PHASE LOCKED LOOP

(75) Inventors: Moises E. Robinson, Austin, TX (US); Marwan M. Hassoun, Davis, CA (US); Earl E. Swartzlander, Jr., Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/299,974

(22) Filed: Dec. 12, 2005

(65) Prior Publication Data

US 2007/0132490 A1    Jun. 14, 2007

(51) Int. Cl.
 *H03L 7/06* (2006.01)
(52) U.S. Cl. ........................ 327/148; 327/157; 327/163
(58) Field of Classification Search ........ 327/146–148, 327/154–157, 162, 163
See application file for complete search history.

(56) References Cited

U.S. PATENT DOCUMENTS

| | | | | |
|---|---|---|---|---|
| 5,180,993 | A * | 1/1993 | Dent | 331/16 |
| 5,319,320 | A * | 6/1994 | Abe et al. | 331/1 A |
| 6,744,292 | B2 * | 6/2004 | Chen et al. | 327/156 |
| 6,873,214 | B2 * | 3/2005 | Harwood | 331/17 |
| 6,885,251 | B2 * | 4/2005 | Delmot et al. | 331/16 |
| 7,009,456 | B2 * | 3/2006 | Jasa et al. | 331/16 |
| 7,015,735 | B2 * | 3/2006 | Kimura et al. | 327/157 |
| 7,078,948 | B2 | 7/2006 | Dosho | |

FOREIGN PATENT DOCUMENTS

EP    1 414 155 A1    4/2004
EP    1 471 645 A1    10/2004

OTHER PUBLICATIONS

Keliu Shu et al.; "A 2.4-GHz Monolithic Fractional-*N* Frequency Synthesizer with Robust Phase-Switching Prescaler and Loop Capacitance Multiplier"; Copyright 2003 IEEE; IEEE Journal of Solid-State Circuits; vol. 38, No. 6; pp. 866-874.

(Continued)

*Primary Examiner*—N. Drew Richards
*Assistant Examiner*—Hai L. Nguyen
(74) *Attorney, Agent, or Firm*—Michael T. Wallace

(57) ABSTRACT

A method and apparatus for capacitance multiplication using two charge pumps. A first charge pump (206) provides a current signal ($I_{216}$) that is first conducted by a resistor (310) of an RC network and then split into three current paths prior to being conducted by a capacitor of the RC network. A first current path provides current to the capacitor (306) of the RC network from node (320). A second current path multiplies the current conducted by capacitor (306) by a first current multiplication factor. A third current path provides current to a second charge pump, which multiplies the current from the first charge pump by a second current multiplication factor that has a fractional value with an inverse magnitude sign relative to the first current multiplication factor. The combination of the second and third current paths effectively multiplies the capacitance magnitude of capacitor (306).

20 Claims, 5 Drawing Sheets

OTHER PUBLICATIONS

Sergio Solis-Bustos et al.; "A 60-dB Dynamic-Range CMOS Sixth-Order 2.4-Hz Low-Pass Filter for Medical Applications"; Copyright 2000 IEEE; IEEE Transaction on Circuits and System II, Analog and Digital Signal Processing; vol. 47; pp. 1391-1398.

Jan Craninckx et al.; "A Fully Integrated CMOS DCS-1800 Frequency Synthesizer"; Copyright 1998 IEEE; IEEE Journal of Solid-State Circuits, vol. 33, No. 12; pp. 2054-2065.

National Semiconductor; Application Note 1001; "An Analysis and Performance Evaluation of a Passive Filter Design Technique for Charge Pump PLLs"; Jul. 2001; pp. 1-8.

F. M. Gardner; "Phaselock Techniques"; Second Edition; Chapter 2; Copyright 1979; published by John Wiley & Sons; New York; pp. 8-24.

Maxim A. et al., "A sub-1psrms jitter 1-5GHz 0.13 CMOS PLL Using a Passive Feedforward Loop Filter with Noisless Resistor Multiplication", 2205 IEEE Radio Frequency Integrated Circuits Symposium, pp. 207-210, available from Crystal, 4120 Industrial Drive, Austin, TX 78730.

Larsson, Patrik, "An Offset-Cancelled CMOS Clock-Recovery/Demux with Half-Rate Linear Phas Detector for 2.5Gb/s Optical Communiction", 2001 IEEE International Solid-State Circuits conference, 3 pages. available from IEEE, 3 Park Avenue, 17th Floor, New York, NY 10016-5997. (best copy available).

* cited by examiner

US 7,307,460 B2

METHOD AND APPARATUS FOR CAPACITANCE MULTIPLICATION WITHIN A PHASE LOCKED LOOP

FIELD OF THE INVENTION

The present invention generally relates to capacitance multiplication, and more particularly to capacitance multiplication using two charge pumps.

BACKGROUND

Various applications of electronic circuitry involve the use of integrated circuits (ICs). ICs, for example, facilitate the ability to incorporate a very large number of circuit elements into a very small area. ICs are particularly useful when active components, such as transistors and diodes, are needed to implement a particular design. Using today's semiconductor technology, for example, hundreds of millions and even billions of active devices may be incorporated into a single IC.

Unfortunately, many circuit applications also require the use of passive components, such as resistors, capacitors, and inductors. In some applications, the formation of passive components may be directly implemented within the semiconductor die itself. Other applications, however, preclude the use of semiconductor die implementations of passive components, since the reactive or resistive density of the silicon process cannot support the magnitude of reactance or resistance that is required.

Maximum capacitance densities, for example, of today's silicon processes are on the order of 10 fempto-Farads per square micrometer ($fF/\mu^2$) Thus, the implementation of a 10 nF capacitance, using actual transistors within the semiconductor die, would require 1 square millimeter ($mm^2$) of semiconductor die area, which precludes their use in many applications due to the excessive semiconductor area requirement. Many electronic designs, therefore, require the use of discrete capacitive components that are external to the semiconductor die, so that larger capacitance values may be implemented without the need to utilize semiconductor die area.

One such electronic design, for example, involves the use of the so-called "clean-up" phase locked loop (PLL). Clean-up PLLs are used to filter phase jitter and phase noise from a reference input clock. As such, their loop bandwidths are required to be quite small, so that phase variations due to high frequency noise may be substantially removed. Accordingly, a large portion of the semiconductor die area is occupied by the loop filter capacitance, since an inverse relationship exists between the loop bandwidth and the capacitance values required by the loop filter to achieve the required loop bandwidth.

Thus, the circuit designer is left with the choice of using a large amount of semiconductor die area to implement the loop filter capacitance, or to use a discrete capacitive element, external to the semiconductor die, to implement the loop filter capacitance. Methods continue to be developed, therefore, that provide the circuit designer with alternative options of implementing capacitive components within the semiconductor die. Such methods should increase the capacitance generated while minimizing the amount of semiconductor die area used.

SUMMARY

To overcome limitations in the prior art, and to overcome other limitations that will become apparent upon reading and understanding the present specification, various embodiments of the present invention disclose an apparatus and method of effectively multiplying the capacitance magnitude of a capacitor integrated within a semiconductor die, while minimizing the semiconductor area required to realize the capacitor.

In accordance with one embodiment of the invention, a phase locked loop (PLL) comprises a detector that is coupled to receive a reference signal and a PLL output signal and is adapted to provide an error signal indicative of a difference between the reference signal and the PLL output signal. The PLL further comprises a first charge pump that is coupled to receive the error signal and is adapted to provide a first current signal in response to the error signal. The PLL further comprises a loop filter that is coupled to receive the first current signal. The loop filter includes a resistive element having a first conductor that is coupled to the first charge pump and a second conductor that is coupled to a common node, a capacitive element having a first conductor that is coupled to the common node and a second conductor that is coupled to a reference potential, and a current mirror that is coupled to the common node and is adapted to conduct a first portion of the first current signal in magnitude proportion to a current conducted by the capacitor. The PLL further comprises a second charge pump that is coupled to the common node and is coupled to receive the error signal. The second charge pump being adapted to extract a second portion of the first current signal from the loop filter.

In accordance with another embodiment of the invention, a capacitance multiplication circuit comprises a first charge pump that is adapted to provide a current signal and a resistor having a first conductor that is coupled to the first charge pump and a second conductor that is coupled to a first node. The resistor being adapted to conduct the current signal to the first node. The capacitance multiplication circuit further comprises a capacitor that is coupled to the first node and is adapted to conduct a first portion of the current signal from the first node. The capacitance multiplication circuit further comprises a current mirror that is coupled to the first node and is adapted to conduct a second portion of the current signal from the first node. The second portion of the current signal being in magnitude proportion to the first portion of the current signal. The capacitance multiplication circuit further comprising a second charge pump that is coupled to the first node and is adapted to conduct a third portion of the current signal from the first node. The second and third portions of the current signal being conducted to decrease a magnitude of the first portion of the current signal relative to a magnitude of the current signal being conducted by the resistor.

In accordance with another embodiment of the invention, a method of operating a phase locked loop (PLL), comprises generating a current signal using a first charge pump, where the current signal indicates a phase error measured by the PLL. The method further comprises conducting the current signal through a resistor to a common node of a loop filter of the PLL, conducting a first portion of the current signal from the common node through a capacitor, conducting a second portion of the current signal from the common node through a current mirror in ratio proportion to the first portion of the current signal, and conducting a third portion of the current signal from the common node using a second charge pump. A magnitude of the first portion of the current signal is decreased with respect to a magnitude of the current signal conducted by the resistor to generate an effective increase in the capacitance magnitude of the capacitor.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
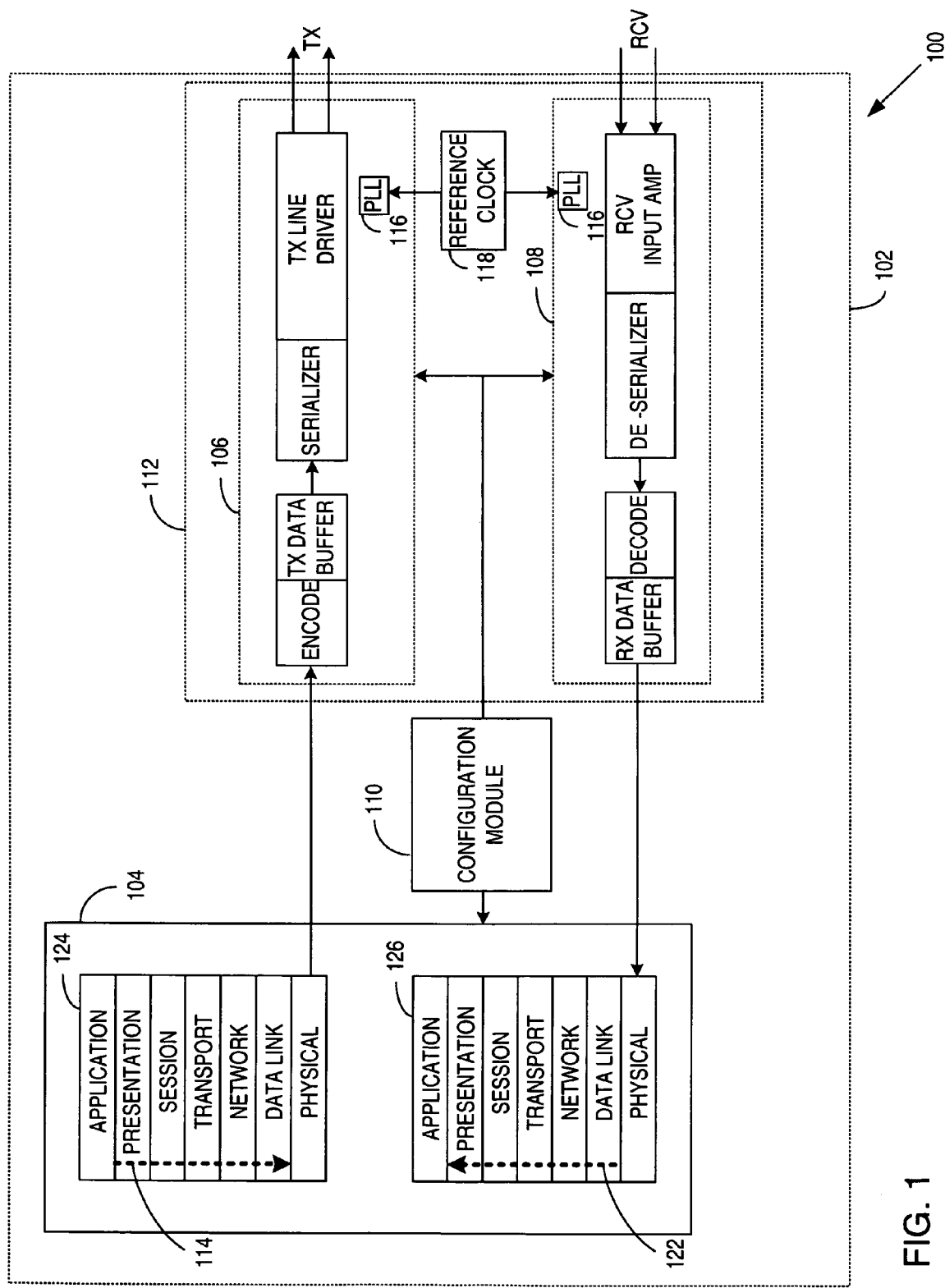
FIG. 1 illustrates an exemplary application of a phase locked loop (PLL)

Generally, the various embodiments of the present invention are applied to capacitance multiplication techniques. Such capacitance multiplication techniques may be employed through the use of discrete elements, or conversely, the capacitance multiplication techniques may be employed within an integrated circuit (IC). Employment of the capacitance multiplication technique within an IC is attractive for many reasons, not the least of which includes the implementation of relatively large capacitance values completely within the confines of a monolithic silicon chip, or IC. Through the use of capacitance multiplication within an IC, for example, the need for external capacitors may be obviated, since the large capacitance values achieved through capacitance multiplication may be large enough to preclude the need for external capacitors.

Application of capacitance multiplication is virtually unlimited. In one embodiment, for example, capacitance multiplication may be applied within a loop filter of a phase locked loop (PLL) that is implemented within a monolithic silicon chip. In particular, those PLLs requiring relatively small loop bandwidths may utilize capacitance multiplication to realize an effective capacitance within the monolithic silicon chip that is large enough to meet the loop bandwidth requirement.

The resulting PLL may then be utilized to facilitate any communication protocol that requires PLL operation, such as is exemplified by communication system 100. Communication system 100 utilizes integrated circuit (IC) 102 to conduct serial communications with external communications equipment (not shown). In one embodiment, IC 102 may represent a programmable logic device (PLD), such as a field programmable gate array (FPGA), whereby configurable logic portion, i.e., fabric 104, and related processor supported functions of configuration module 110 are used to implement communication stacks 124 and 126 in support of the various communication protocols.

Using such an arrangement, data frames outbound from FPGA fabric 104 may propagate from, for example, the application layer to the physical layer of communication stack 124 via communication path 114. Similarly, data frames inbound to FPGA fabric 104 may propagate from, for example, the physical layer to the application layer of communication stack 126 via communication path 122. The particular communication protocol implemented by communication system 100 may be, for example, Gigabit Ethernet, whereby the physical (PHY) layer is implemented using the physical media attachment (PMA) and the physical coding sublayer (PCS) of multi-gigabit transceiver (MGT) 112.

MGT 112, for example, may implement the PMA and the PCS via transmitter 106 and receiver 108. Included with the PMA function, for example, are the serializer/deserializer (SERDES), the transmit line driver, the receiver input amplifier, clock generation and clock and data recovery (CDR) portions (not shown) of MGT 112.

Included with the PCS function, on the other hand, is the encoding/decoding function where, for example, 8B/10B or 64B/66B encoding/decoding is performed. The PCS function may also perform scrambling/descrambling functions and elastic buffering in support of channel bonding and clock correction. In support of the configuration and/or partial reconfiguration of FPGA fabric 104 and MGT 112, is configuration module 110, which may provide an on-board microprocessor, to further enable communication protocol support and PMA/PCS parameter control.

Communication system 100 may, in an alternate embodiment, represent a synchronous optical network (SONET) optical transmission system. As such, the output of transmitter 106 must meet the jitter generation requirements to achieve high quality optical transmission. If reference clock 118 provides an excessively noisy output, however, then clean-up PLL 116 may be necessary to attenuate the jitter on the output of reference clock 118 in order to meet the jitter generation specification at the output of transmitter 106. It should be noted that a single PLL may be used for transmitter 106 and receiver 108 of MGT 112.

Figure 2:
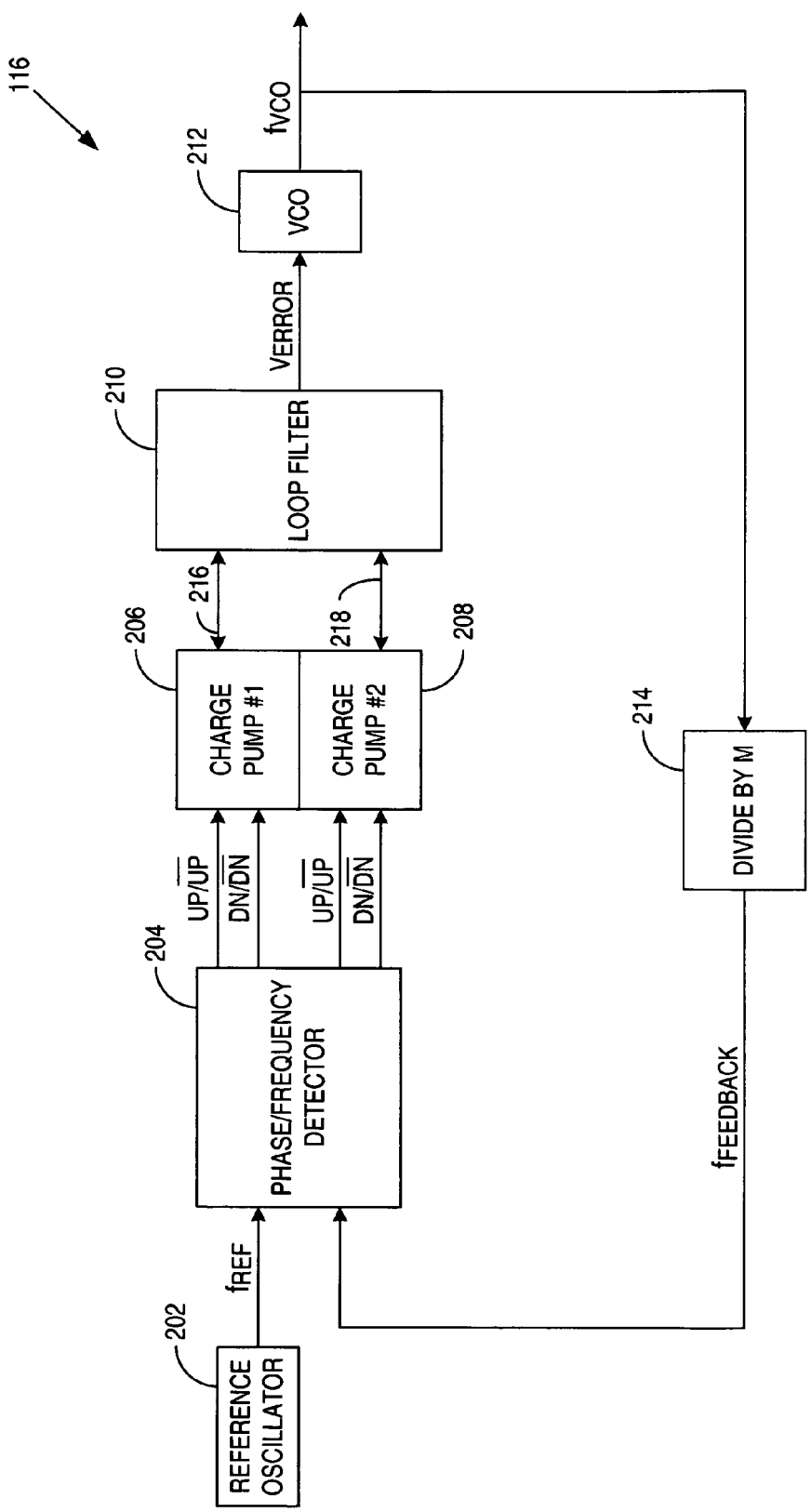
FIG. 2 illustrates an exemplary block diagram of the PLL of FIG. 1.

Turning to FIG. 2, an exemplary block diagram of a 3rd order, type II PLL, which may be used to implement PLL 116 of FIG. 1, is illustrated. Implementation of PLL 116 may be fully contained within a monolithic silicon chip due to the capacitance multiplication operation performed through the use of dual charge pumps 206 and 208. As discussed in more detail below, current signal 216 and current signal 218 provide an extra degree of freedom for the programmable multiplication of the loop filter capacitance (not shown) contained within loop filter 210. As such, the actual loop filter capacitance implemented within the monolithic silicon chip may be constructed so as to minimize the amount of semiconductor area required. Furthermore, capacitance multiplication may be utilized to augment the actual capacitance implemented to create an effective capacitance that meets the design criteria of the PLL.

PLL 116 exemplifies a charge-pump based PLL (CPLL), which is an attractive PLL design implementation that facilitates flexible design tradeoffs by decoupling various design parameters, such as loop bandwidth, damping factor, and lock range. CPLL 116 consists of, for example, phase/frequency detector 204, charge pump #1 206, charge pump #2 208, loop filter 210, voltage controlled oscillator (VCO) 212, and optional divider 214 that may be used in PLL applications requiring clock multiplication.

Clock multiplication may be necessary, for example, when the output frequency of VCO 212 is operative in the range of 5 gigahertz (GHz), but reference oscillator 202 may only be operating at a frequency of 156.25 megahertz (Mhz). In such an instance, a clock multiplication of 32 is implemented through the use of feedback division, such that the 156.25 Mhz reference signal, $f_{REF}$, supplied by reference oscillator 202 may be compared in both phase and frequency to the 5 GHz output of VCO 212. As such, the feedback frequency, $f_{FEEDBACK}$, may be generated in accordance with equation (1):

$$f_{FEEDBACK} = f_{vco}/M, \quad (1)$$

where $f_{vco}$ is the output frequency of VCO 212 and M is the integer divisor provided by divider 214. In this instance, M may be set to 32, since 5 GHz/32=156.25 Mhz, which is equal to the reference frequency, $f_{REF}$.

In operation, phase/frequency detector 204 supplies two pairs of digital signals, e.g., UP and DN, and complementary signals, e.g., $\overline{UP}$ and $\overline{DN}$, which corresponds to the phase/frequency error between $f_{REF}$ and $f_{FEEDBACK}$. For example, if the phase/frequency of the output of divider 214 is lagging signal $f_{REF}$, then the pulse width of signal UP may increase and the pulse width of signal DN may decrease to cause the phase/frequency of VCO 212 to be advanced in phase/frequency. Conversely, if the phase/frequency of the output of divider 214 is advanced with respect to signal $f_{REF}$, then the pulse width of signal UP may decrease and the pulse width of signal DN may increase to cause the phase/frequency of VCO 212 to be retarded in phase/frequency.

Charge pumps 206 and 208 react to the phase/frequency error signals by generating current signal 216, $I_{216}$, and current signal 218, $I_{218}$, in response to the phase/frequency error signals. For example, if the pulse width of signal UP is increased, the magnitude of current signals 216 and 218 may also increase. Conversely, if the pulse width of signal DN is increased, then the magnitude of current signals 216 and 218 may also decrease. It should be noted that the sign of current signals $I_{216}$ and $I_{218}$ are opposite in polarity, such that $I_{216}$ flows into loop filter 210, while $I_{218}$ flows away from loop filter 210 for an up pulse. The opposite is true for a down pulse, such that current $I_{216}$ flows out of loop filter 210 while $I_{218}$ flows into loop filter 210.

Current signals $I_{216}$ and $I_{218}$ are then converted into an error voltage, $V_{ERROR}$, by loop filter 210, which is then supplied to VCO 212 to set the output frequency, $f_{VCO}$, of VCO 212. Through negative feedback, the phase/frequency error between $f_{REF}$ and $f_{FEEDBACK}$ is forced to be substantially zero through operation of CPLL 116. By changing the value of the divisor, M, the output frequency, $f_{VCO}$, may be programmed to operate over a frequency range of one or more frequency decades as required by the particular application, while maintaining frequency/phase coherency with reference frequency, $f_{REF}$.

Figure 3:
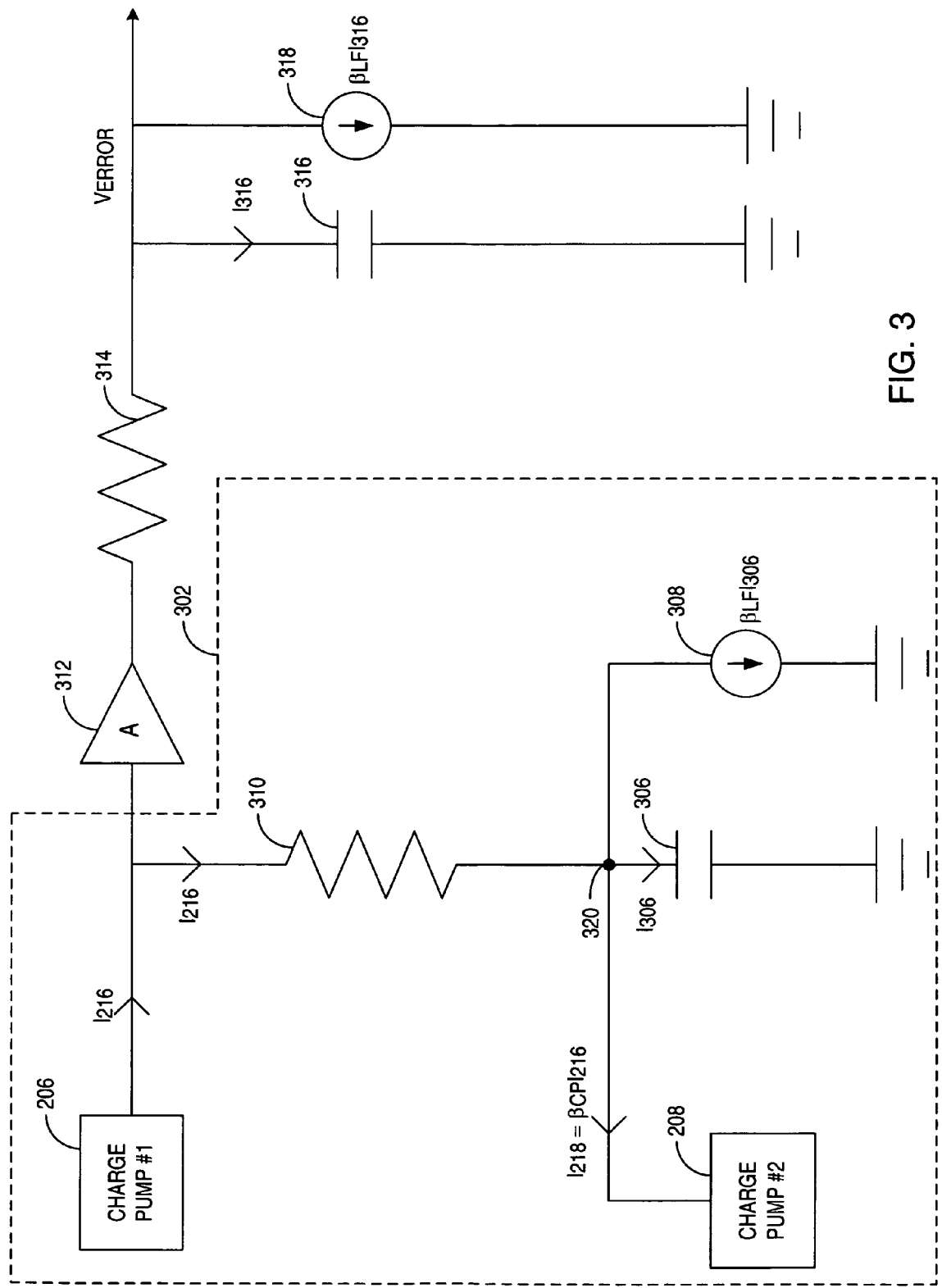
FIG. 3 illustrates an exemplary block diagram of the loop filter of the PLL of FIG. 2.

Turning to FIG. 3, an exemplary schematic diagram of loop filter 210 is illustrated. Loop filter 210 is said to be an active loop filter due to the operation of amplifier 312, which as discussed in more detail below, provides selective noise filtering capability. Amplifier 312 also virtually guarantees, through its high input impedance, that the magnitude of charge pump #1 206 output current signal, $I_{216}$, is fully conducted by resistor 310. This condition becomes significant when the magnitude of charge pump #2 208 output current, $I_{218}$, approaches the magnitude of charge pump #1 206 output current, $I_{216}$. In an alternate embodiment, however, amplifier 312 may be removed if the impedance presented by resistor 314 and capacitor 316 is made to be large enough to substantially guarantee that virtually all of current $I_{216}$ is conducted by resistor 310 in the absence of amplifier 312. In an alternate embodiment, resistor 314 may also be removed if amplifier 312 is removed.

Capacitance multiplication circuit 302 is employed to multiply the capacitance magnitude of capacitor 306 to generate an effective capacitance, $C_{306}$, that is larger than the actual capacitance value of capacitor 306, $C_{306}$. In particular, current mirror 308 facilitates a first capacitance multiplier, whereby the capacitance magnitude of capacitor 306 is scaled up by a factor of $(1+\beta_{LF})$, which is the programmable current gain of current mirror 308. Thus, the current conducted by current mirror 308 is a multiple of the current, $I_{306}$, that is conducted by capacitor 306.

Capacitance multiplication is achieved at node 320 as follows. The effective impedance at node 320 is inversely proportional to the amount of current input to node 320, i.e., current $I_{216}$. If the amount of current flowing into node 320 is increased while the voltage at node 320 remains constant, then the impedance at node 320 is effectively reduced. Since the impedance at node 320 is capacitive, the effective capacitance must thereby increase, since the impedance of capacitor 306 is inversely proportional to its capacitance.

Charge pump #2 208 provides a similar capacitance multiplier, except that the sign of the current conducted by charge pump #2 208 is negative with respect to current $I_{216}$. In this instance, therefore, the capacitance of capacitor 306 is scaled up by a factor that is proportional to $1/(1-\beta_{CP})$, where $\beta_{CP}$ is a programmable value that is greater than or equal to 0, but less than 1. Thus, $\beta_{LF}$ and $\beta_{CP}$ represent first and second capacitance scaling factors that combine to produce a capacitance multiplier that may be described by equation (2)

$$C'_{306} = C_{306}\left[\frac{1+\beta_{LF}}{1-\beta_{CP}}\right]. \quad (2)$$

Since $\beta_{CP}$ is less than 1, the denominator term, $1-\beta_{CP}$, becomes a multiplier of the $1+\beta_{LF}$ numerator term, which provides a squaring effect when capacitance, $C_{306}$, is multiplied to create effective capacitance $C'_{306}$.

Similarly, capacitance $C_{316}$ may be multiplied by the scaling factor, $(1+\beta_{LF})$, through operation of optional current mirror 318 to yield the capacitance multiplier for capacitor 316 as expressed in equation (3):

$$C'_{316} = C_{316}(1+\beta_{LF}). \quad (3)$$

Thus, the effective impedance for loop filter 210 may be given by equation (4):

$$Z(s) = \frac{V_{ERROR}}{I_{216}} \cong A * \frac{1+s\tau'_{306}}{sC'_{306}(1+s\tau'_{316})}, \quad (4)$$

where $\tau'_{306} = R_{310} * C'_{306}$, $\tau'_{316} = R_{314} * C'_{316}$, A is the gain of amplifier 312, $R_{310}$ is the resistance magnitude of resistor 310, and $R_{314}$ is the resistance magnitude of resistor 314.

In order to maintain stability, e.g., at least a 60° phase margin, time constant $\tau'_{306}$ should be at least 16 times larger than $\tau'_{316}$, which implies that $C'_{306}$ should be 16 times larger than $C'_{316}$, assuming $R_{310}$ is equal to $R_{314}$. By taking the ratio of $C'_{306}$ to $C'_{316}$, we have:

$$\frac{C'_{306}}{C'_{316}} = \frac{C_{306}}{C_{316}} * \frac{1}{1-\beta_{CP}}. \quad (5)$$

Given that a practical maximum of $\beta_{CP}$ may be set to, e.g., 0.9, the capacitance ratio of equation (5) is much greater than 16, since in most practical embodiments, $C_{306}$ is much larger than $C_{316}$. Thus, capacitance multiplication of capacitor $C_{316}$ using current mirror 318 may not be necessary and in these embodiments, current mirror 318 may be removed.

By setting $\beta_{CP}$ to, for example, 0.9, and by assuming a maximum value of $C_{306}'$ to be, for example, 10 nano-Farads (nF), equation (2) may be manipulated to find the actual capacitance value for $C_{306}$ as in equation (6).

$$C_{306} = \frac{C'_{306}}{10*(1+\beta_{LF})} \quad (6)$$

Thus, by setting $\beta_{LF}$ to, for example, 20, yields an actual capacitance value for $C_{306}$ of 47.62 pF. Since loop filter 210 may be implemented as a differential loop filter, two capacitors may be needed for a total capacitance magnitude of 95.24 pF. Assuming a capacitance density of 10 fF/$\mu^2$, then the total silicon area required for two, 10 nF capacitors is given by equation (7) as:

$$\text{Area} = \frac{C_{TOTAL}}{C_{DENSITY}} = \frac{95.24 \text{ pF}}{10 \text{ fF}/\mu^2}, \quad (7)$$

which yields 0.009524 mm$^2$. In other words, 98μ×98μ of semiconductor die area is needed to implement two, 10 nF effectively multiplied capacitors (e.g., $C_{306}'$) with two 47.62pF (e.g., $C_{306}$) physically implemented capacitors. Without the capacitance multiplication factor, $(1+\beta_{LF})/(1-\beta_{CP})$, it would take 2 square millimeters (mm$^2$) of semiconductor die area to implement two 10 nF capacitors. It should also be noted that resistors 310 and 314 may be implemented using transistors to further decrease the semiconductor die area required by loop filter 210.

One of the main functions of a clean-up PLL is to filter the noise from a noisy reference clock or reference oscillator. Generally speaking, there are two major noise sources of a CPLL; the reference noise and the VCO noise. Looking first at the noise transfer function of the reference noise of CPLL 116, we have:

$$\frac{\Phi_{OUT}}{\Phi_{REF}} = \frac{G_{fwd}}{1+T_A} = M * \frac{T_A}{1+T_A} = M * \frac{T*A}{1+T*A}, \quad (8)$$

where $G_{fwd}$ is the forward gain from phase/frequency detector 204 to the PLL output, M is the divisor of divider 214, T is the product of the forward gain, $G_{fwd}$, and the reverse gain, $G_{rev}$, and A is the gain of amplifier 312. The reverse gain, $G_{rev}$, is defined as the gain from the PLL output to the input of phase/frequency detector 204.

At a frequency of 0 Hz, or DC, the reference noise transfer function of equation (8) evaluates to M, whereas at very high frequencies, the reference noise transfer function of equation (8) evaluates to 0. Thus, the frequency response of the reference noise transfer function is low-pass and has a 3-dB corner frequency that is defined by the loop gain, T, and scaled by the gain, A, of amplifier 312, assuming all other loop components stay constant.

It should be noted, that when adjusting the gain, A, of amplifier 312, the value of the loop resistance (resistors 310 and 314) should be scaled in inverse proportion to the square root of the gain as described by equation (9)

$$R_{SCALED} = R * \frac{1}{\sqrt{A}}, \quad (9)$$

in order to maintain stability. For example, if the gain, A, of amplifier 312 is increased to 100, then the magnitude of the resistance values of resistors 310 and 314 should be scaled down by 1/10. Conversely, if the gain, A, of amplifier 312 is decreased from 100 to 1, then the magnitude of the resistance values of resistors 310 and 314 should be increased by a factor of 10.

The 3-dB corner frequency of the reference noise transfer function is given as, $$f_C = \frac{1}{2\pi} \times \frac{I_{216} \cdot K_{VCO} \cdot A \cdot R_{310}}{M}, \quad (10)$$

where $K_{VCO}$ is the VCO gain.

By setting A=1 in equation (8), for example, the 3-dB corner frequency of the reference noise transfer function is decreased by a factor of 10, when compared to the 3-dB corner frequency of the reference noise transfer function when using a gain setting of A=100. Thus, the overall reference noise contribution at the output of CPLL 116 is decreased through a decrease of the gain of amplifier 312 in loop filter 210.

The VCO noise transfer function is given by equation (11):

$$\frac{\Phi_{OUT}}{\Phi_{VCO}} = \frac{M}{M+G_{fwd}} = \frac{1}{1+T_A} = \frac{1}{1+T*A}, \quad (11)$$

which evaluates to 0 at 0 Hz and to 1 at very high frequencies. Thus, the frequency response of the VCO noise transfer function is high-pass, where the 3-dB corner frequency is defined by the loop gain, T, scaled by the gain, A, of amplifier 312.

The 3-dB corner frequency of the VCO noise transfer function of equation (11) is increased by a factor of 10 when gain, A, of amplifier 312 is increased by 100. Since the frequency response of the VCO noise transfer function is high-pass, however, the overall VCO noise contribution at the output of CPLL 116 is decreased through an increase of the gain of amplifier 312 in loop filter 210. Conversely, the overall VCO noise contribution at the output of CPLL 116 is increased through a decrease of the gain of amplifier 312 in loop filter 210.

Thus, by virtue of equations (8) and (11), an extra degree of freedom is introduced through the use of amplifier 312 in loop filter 210 to optimize the CPLL noise performance. On the one hand, if reference noise is a concern, then the gain, A, of amplifier 312 may be decreased, so that the reference noise contribution at the output of CPLL 116 may be decreased. On the other hand, if VCO noise is a concern, then the gain, A, of amplifier 312 may be increased, so that the VCO noise contribution at the output of CPLL 116 may be decreased.

In addition, use of amplifier 312 may provide the ability to introduce a DC offset into the input of VCO 212 of FIG. 2. In particular, the DC operating range of charge pumps 206 and 208 may not match the DC operating range of VCO 212. As such, amplifier 312 may be used to provide not only variable gain, A, but also a variable DC offset that may be used to match the DC operation range of charge pumps 206, 208 with the DC operating range of VCO 212.

Figure 4:
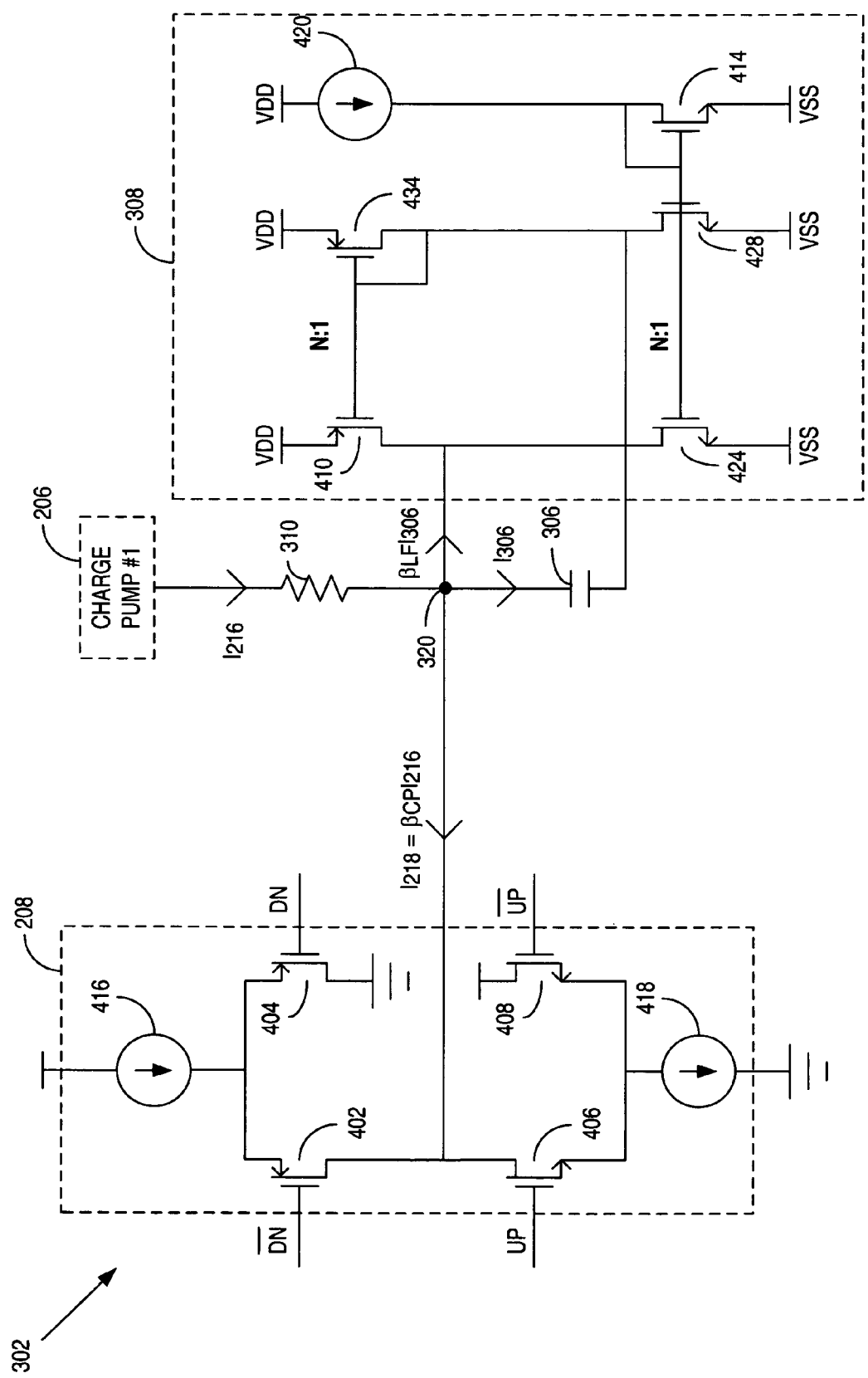
FIG. 4 illustrates an exemplary schematic diagram of the capacitance multiplication circuit of FIG. 3.

Turning to FIG. 4, an exemplary schematic diagram of capacitance multiplication circuit 302 is illustrated. As discussed above, capacitance multiplication circuit 302 utilizes charge pump #1 206, charge pump #2 208 and current mirror 308 to multiply the actual capacitance value of capacitor 306 in accordance with equation (2).

Selection of the first current multiplication factor, $\beta_{LF}$, may be illustrated through an explanation of the operation of current mirror 308 as exemplified in FIG. 4. Capacitor 306 is coupled in series with transistor 428, which requires that current $I_{306}$, as conducted by capacitor 306, also be conducted by transistor 434. The gate to source potential, $V_{GS}$, of transistor 428 is held to be substantially constant by operation of current source 420 and diode connected transistor 414. Thus, the current conducted by transistor 434 must decrease by any increase in the current $I_{306}$.

Since the gate and drain terminals of diode connected transistor 434 are coupled to the gate terminal of transistor 410, the decrease in current through transistor 434 causes a decrease in the drain current through transistor 410. The current conducted by transistor 424, however, is held substantially constant, since the $V_{GS}$ of transistor 424 is held to be substantially constant by operation of current source 420 and diode connected transistor 414.

In response to the decrease in current conducted by transistor 410, therefore, current $\beta_{LF}I_{306}$ must increase to supplement the current that is required by transistor 424. The amount of the increase in current, $\beta_{LF}I_{306}$, is determined by the current gain of current mirror 308. In particular, the current conducted by transistor 410 is geometrically proportional to the current conducted by transistor 434. If the channel width of transistor 410 is N times larger than the channel width of transistor 434, for example, then transistor 410 conducts a magnitude of current that is N times the magnitude of current conducted by transistor 434. Thus, current $I_{306}$, as conducted by capacitor 306, is related to current $\beta_{LF}I_{306}$ by the multiplication factor, N, such that the first multiplication factor, $\beta_{LF}$, is equal to N.

Turning to an explanation of the operation of charge pump #2 208, a derivation of the second multiplication factor, $\beta_{CP}$, is facilitated. Generally, charge pump #2 208 is identical to charge pump #1 206, except that the digital signals, e.g., UP and DN, along with their complementary signals, e.g., $\overline{UP}$ and $\overline{DN}$, corresponding to the phase/frequency error between $f_{REF}$ and $f_{FEEDBACK}$, are reversed. That is to say, in other words, that the current control signals for charge pump #2 208 are switched with respect to the current control signals for charge pump #1 206 in order to achieve the sign difference between current signals $I_{218}$ and $I_{216}$, respectively.

In operation, current control signal UP operates to increase the magnitude of current signal $I_{218}$ that is being conducted by transistor 406 and current source 418, while current control signal $\overline{UP}$ operates to decrease the magnitude of current that is being conducted by transistor 408. Thus, the current generated by current source 418 is shared between transistor 406 and transistor 408, and current $I_{218}$ is being taken out of common node 320.

It should be noted, that the magnitude of current signal $I_{218}$ may be increased to a maximum value that is equal to the current conducted by current source 418. By adjusting the magnitude of current source 418 to be proportional to current signal $I_{216}$, e.g., equal to 90% of $I_{216}$ for all values of $I_{216}$, then an upper limit of 0.9 may be predetermined for $\beta_{CP}$ as in equation (2).

Similarly, current control signals DN and $\overline{DN}$ operate to increase the magnitude of current $I_{218}$ being "sourced" into common-node 320. When $\overline{DN}$ is at a logic low and DN is at a logic high, all of the current from current source 416, $I_{416}$, flows into common-mode node 320. Alternatively, when DN is at a logic low and $\overline{DN}$ is at a logic high, none of current $I_{416}$ flows into common-node 320.

Figure 5:
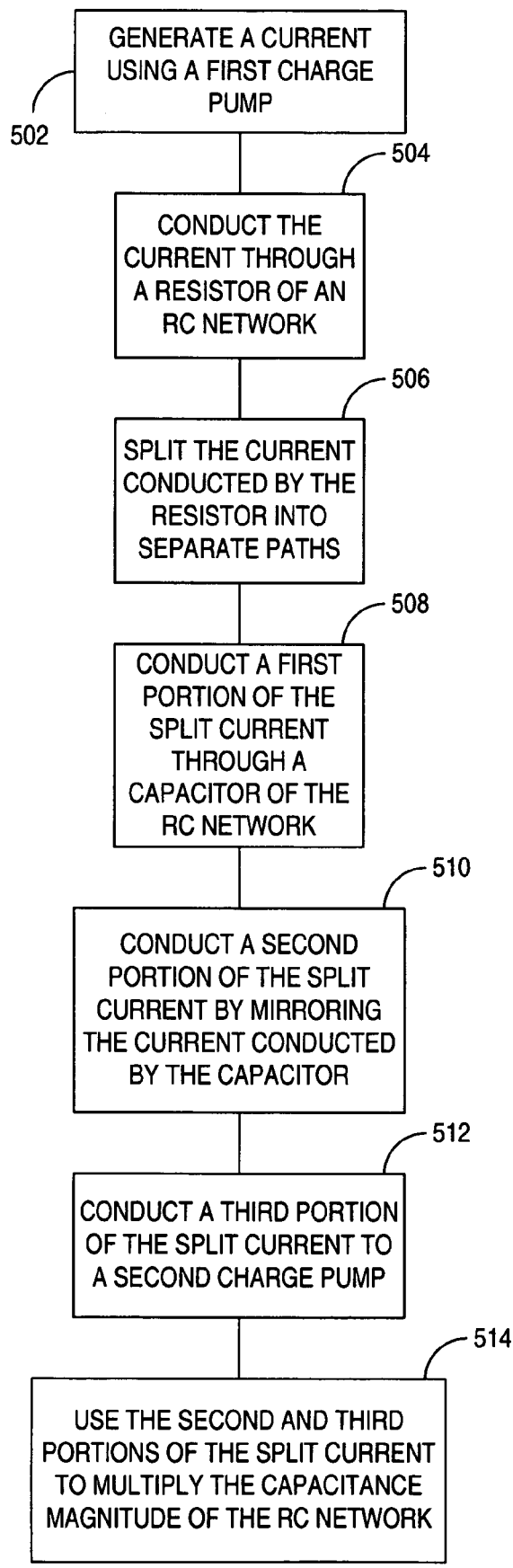
FIG. 5 illustrates an exemplary flow diagram of a capacitance multiplication algorithm.

It should similarly be noted, that the magnitude of current signal $I_{218}$ may be decreased to a minimum value of 0. A value of 0 amps may be achieved for the magnitude of current signal $I_{218}$, by asserting signal $\overline{DN}$ to a logic high value and deasserting signal UP to a logic low value. Alternatively, the magnitude of $I_{218}$ can be made 0 by matching current sources 416 and 418 to each other, and by pulsing signal $\overline{DN}$ to a logic low value, while pulsing signal UP to a logic high value for an equal duration, as is the case during the PLL lock condition Turning to FIG. 5, a flow chart of an exemplary method for multiplying capacitance is illustrated with reference being made to FIG. 4. In step 502, a first charge pump is utilized to generate a current signal, e.g., $I_{216}$, to be conducted by a resistive element of an RC network, e.g., resistor 310, as in step 504. At node 320, current signal $I_{216}$ conducted by resistor 310 is split into separate paths as in step 506 before being conducted by capacitor 306.

The first current path is generated, such that a portion of current signal $I_{216}$ is conducted through capacitor 306 from node 320 as in step 508. A second current path from node 320 is created by mirroring the current conducted by capacitor 306 as in step 510. The second current path conducts a magnitude of current that is proportional to the amount of current conducted by capacitor 306. In particular, the amount of current conducted by the second current path is equal to the product of current signal $I_{306}$ and the current gain, e.g., $\beta_{LF}$, of current mirror 308.

A third current path is generated as in step 512, whereby current signal $I_{218}$ is created with an opposite sign as compared to current signal $I_{216}$. Further, the magnitude of current signal $I_{218}$ is fractionally proportional to the magnitude of current signal $I_{216}$, such that the magnitude of current signal $I_{218}$ may be programmed between the exemplary range of 0 and $0.9*I_{216}$. Thus, $\beta_{CP}$ of equation (2) may take on values between, for example, 0 and 0.9. The value of $\beta_{CP}$ may be programmed to approach 1, but as discussed above in relation to equation (5), values greater than 0.9 are likely not required and may also be impractical due to matching and feedforward stability limitations.

Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A phase locked loop (PLL), comprising:
   a detector coupled to receive a reference signal and a PLL output signal and adapted to provide an error signal indicative of a difference between the reference signal and the PLL output signal;
   a first charge pump coupled to receive the error signal and adapted to provide a first current signal in response to the error signal;

a loop filter coupled to receive the first current signal, the loop filter including,
 a resistive element having a first conductor coupled to the first charge pump and a second conductor coupled to a common node;
 a capacitive element having a first conductor coupled to the common node and a second conductor coupled to a reference potential; and
 a current mirror coupled to the common node and adapted to conduct a first portion of the first current signal in magnitude proportion to a current conducted by the capacitor; and
 a second charge pump coupled to the common node and coupled to receive the error signal, the second charge pump being adapted to extract a second portion of the first current signal from the loop filter.

2. The PLL of claim 1, wherein the loop filter further comprises an amplifier having an input coupled to the first conductor of the resistive element and the first charge pump and having an output coupled to an output of the loop filter.

3. The PLL of claim 2, wherein the current mirror comprises:
 a first transistor having a first conductor coupled to the common node and a control terminal coupled to a second node;
 a second transistor having a first conductor coupled to the common node and a control terminal coupled to a third node; and
 a third transistor having a first conductor coupled to the second conductor of the capacitive element at the second node and a control terminal coupled to the third node, wherein the third transistor is in geometric proportion to the second transistor.

4. The PLL of claim 3, wherein the current mirror further comprises a fourth transistor having a first conductor and a control terminal coupled to the second node, wherein the fourth transistor is in geometric proportion to the first transistor.

5. The PLL of claim 4, wherein the current mirror further comprises a fifth transistor having a first conductor and a control terminal coupled to the third node.

6. The PLL of claim 5, wherein the current mirror further comprises a current source coupled to the third node.

7. The PLL of claim 5, wherein the second charge pump comprises:
 a sixth transistor having a first conductor coupled to the common node and a control terminal coupled to receive the error signal; and
 a seventh transistor having a first conductor coupled to the common node and a control terminal coupled to receive the error signal.

8. The PLL of claim 7, wherein the second charge pump further comprises:
 an eighth transistor having a first conductor coupled to a second conductor of the sixth transistor at a fourth node; and
 a ninth transistor having a first conductor coupled to a second conductor of the seventh transistor at a fifth node.

9. The PLL of claim 8, wherein the second charge pump further comprises:
 a first current source coupled to the fourth node; and
 a second current source coupled to the fifth node.

10. A capacitance multiplication circuit, comprising:
 a first charge pump adapted to provide a current signal;
 a resistor having a first conductor coupled to the first charge pump and a second conductor coupled to a first node, the resistor being adapted to conduct the current signal to the first node;
 a capacitor coupled to the first node and adapted to conduct a first portion of the current signal from the first node;
 a current mirror coupled to the first node and adapted to conduct a second portion of the current signal from the first node, the second portion of the current signal being in magnitude proportion to the first portion of the current signal; and
 a second charge pump coupled to the first node and adapted to conduct a third portion of the current signal from the first node, the second and third portions of the current signal being conducted to decrease a magnitude of the first portion of the current signal relative to a magnitude of the current signal being conducted by the resistor.

11. The capacitance multiplication circuit of claim 10, wherein the current mirror comprises:
 a first transistor having a first conductor coupled to the first node and a control terminal coupled to a second node;
 a second transistor having a first conductor coupled to the first node and a control terminal coupled to a third node; and
 a third transistor having a first conductor coupled to the second node and a control terminal coupled to the third node, wherein the third transistor is in geometric proportion to the second transistor.

12. The capacitance multiplication circuit of claim 11, wherein the current mirror further comprises a fourth transistor having a first conductor and a control terminal coupled to the second node, wherein the fourth transistor is in geometric proportion to the first transistor.

13. The capacitance multiplication circuit of claim 12, wherein the current mirror further comprises a fifth transistor having a first conductor and a control terminal coupled to the third node.

14. The capacitance multiplication circuit of claim 13, wherein the current mirror further comprises a current source coupled to the third node.

15. The capacitance multiplication circuit of claim 13, wherein the second charge pump comprises:
 a sixth transistor having a first conductor coupled to the first node and a control terminal coupled to receive a current control signal; and
 a seventh transistor having a first conductor coupled to the first node and a control terminal coupled to receive the current control signal.

16. The capacitance multiplication circuit of claim 15, wherein the second charge pump further comprises:
 an eighth transistor having a first conductor coupled to a second conductor of the sixth transistor; and
 a ninth transistor having a first conductor coupled to a second conductor of the seventh transistor.

17. A method of operating a phase locked loop (PLL), comprising:
 generating a current signal using a first charge pump, the current signal being indicative of a phase error measured by the PLL;
 conducting the current signal through a resistor to a common node of a loop filter of the PLL;
 conducting a first portion of the current signal from the common node through a capacitor;

conducting a second portion of the current signal from the common node through a current mirror in ratio proportion to the first portion of the current signal; and conducting a third portion of the current signal from the common node using a second charge pump, wherein a magnitude of the first portion of the current signal is decreased with respect to a magnitude of the current signal conducted by the resistor to generate an effective increase in the capacitance magnitude of the capacitor.

18. The method of claim 17, further comprising prohibiting the current signal from propagating to an output of the loop filter.

19. The method of claim 17, further comprising decreasing a loop bandwidth of the loop filter with the increased capacitance magnitude of the capacitor.

20. The method of claim 17, further comprising:
decreasing a gain of the loop filter to decrease a magnitude of a first noise component at an output of the PLL; and
increasing the gain of the loop filter to decrease a magnitude of a second noise component at the output of the PLL.

* * * * *